(12) United States Patent
Kim et al.

(10) Patent No.: US 10,403,796 B2
(45) Date of Patent: Sep. 3, 2019

(54) LIGHT EMITTING DEVICE AND METHOD OF FABRICATING THE SAME

(71) Applicant: SEOUL VIOSYS CO., LTD., Gyeonggi-do (KR)

(72) Inventors: Chang Yeon Kim, Ansan-si (KR); Ju Yong Park, Ansan-si (KR); Sung Su Son, Ansan-si (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 71 days.

(21) Appl. No.: 15/520,813

(22) PCT Filed: Oct. 15, 2015

(86) PCT No.: PCT/KR2015/010874
§ 371 (c)(1),
(2) Date: Apr. 20, 2017

(87) PCT Pub. No.: WO2016/064134
PCT Pub. Date: Apr. 28, 2016

(65) Prior Publication Data
US 2018/0309029 A1 Oct. 25, 2018

(30) Foreign Application Priority Data

Oct. 21, 2014 (KR) .......................... 10-2014-0142576

(51) Int. Cl.
*H01L 33/42* (2010.01)
*H01L 33/24* (2010.01)
(Continued)

(52) U.S. Cl.
CPC .............. *H01L 33/42* (2013.01); *H01L 33/24* (2013.01); *H01L 33/382* (2013.01); *H01L 33/405* (2013.01); *H01L 2933/0016* (2013.01)

(58) Field of Classification Search
CPC ....... H01L 33/42; H01L 33/382; H01L 33/24; H01L 33/44; H01L 33/405; H01L 2933/0016; H01L 2933/0025
See application file for complete search history.

(56) References Cited

U.S. PATENT DOCUMENTS

2012/0074441 A1* 3/2012 Seo ........................ H01L 27/153
257/91
2014/0055858 A1* 2/2014 Chapman ............... G02B 1/118
359/530

(Continued)

FOREIGN PATENT DOCUMENTS

CN 1734798 A 2/2006
CN 102447016 A 5/2012

(Continued)

OTHER PUBLICATIONS

International Search Report and Written Opinion for PCT/KR2015/010874, filed Oct. 15, 2015, Applicant: Seoul Viosys Co., Ltd., dated Jan. 26, 2016, ISA/KR, 9 pages.

(Continued)

*Primary Examiner* — Sonya D. McCall-Shepard
(74) *Attorney, Agent, or Firm* — Perkins Coie LLP

(57) ABSTRACT

A light emitting device and a method of fabricating the same. The light emitting device includes: a light emitting structure including a first conductive type semiconductor layer, a second conductive type semiconductor layer, an active layer, and a partially exposed region of an upper surface of the first conductive type semiconductor layer; a transparent electrode disposed on the second conductive type semiconductor layer; a first insulation layer including a first opening and a second opening; a metal layer at least partially covering the first insulation layer; a first electrode electrically connected to the first conductive type semiconductor layer; and a second electrode electrically connected to the transparent electrode.

21 Claims, 7 Drawing Sheets

(51) Int. Cl.
   *H01L 33/38*      (2010.01)
   *H01L 33/40*      (2010.01)

(56)  References Cited

U.S. PATENT DOCUMENTS

| | | | | | |
|---|---|---|---|---|---|
| 2014/0183586 | A1* | 7/2014 | Kamiya | ................ | H01L 33/382 |
| | | | | | 257/98 |
| 2015/0076547 | A1* | 3/2015 | Totani | ................... | H01L 33/145 |
| | | | | | 257/98 |
| 2015/0200338 | A1* | 7/2015 | Kim | ........................ | H01L 33/44 |
| | | | | | 257/88 |
| 2015/0359056 | A1* | 12/2015 | Song | ................. | H05B 33/0827 |
| | | | | | 315/186 |

FOREIGN PATENT DOCUMENTS

| | | | |
|---|---|---|---|
| CN | 102460744 | A | 5/2012 |
| JP | 2009194367 | A | 8/2009 |
| JP | 2012069909 | A | 4/2012 |
| JP | 2012169332 | A | 9/2012 |
| KR | 20120115775 | A | 10/2012 |
| KR | 20130030178 | A | 3/2013 |

OTHER PUBLICATIONS

First Office Action in Chinese Patent Application No. 201510683630.8, dated Aug. 18, 2017.
Office Action dated Mar. 20, 2018 in Chinese Patent Application No. 201510683630.8, 23 pages, with English translation.

* cited by examiner

[Fig. 1]
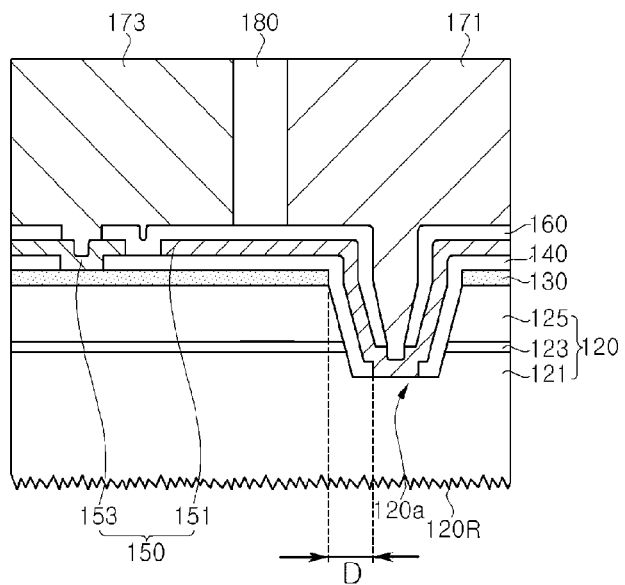
[Fig. 2]
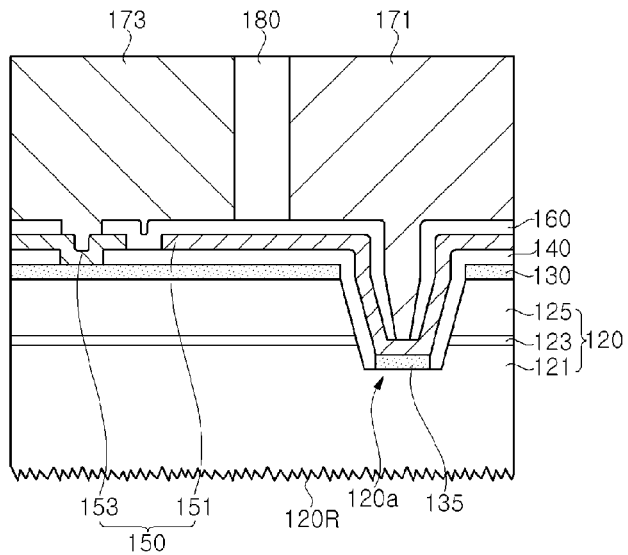

[Fig. 3a]
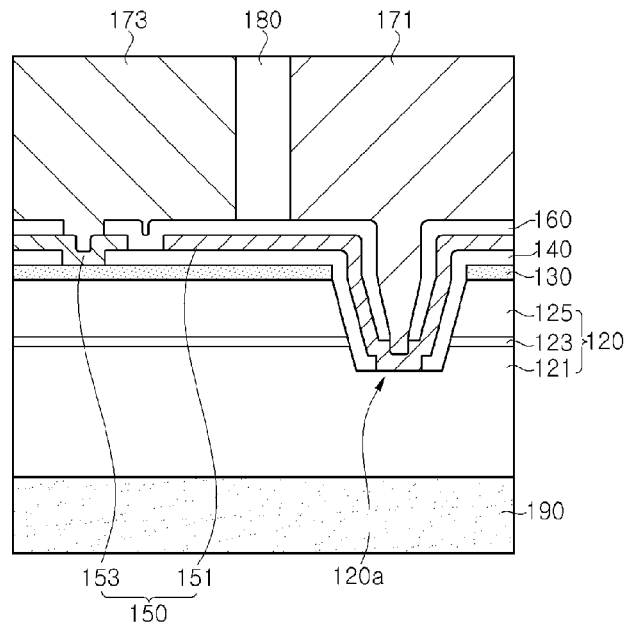
[Fig. 3b]
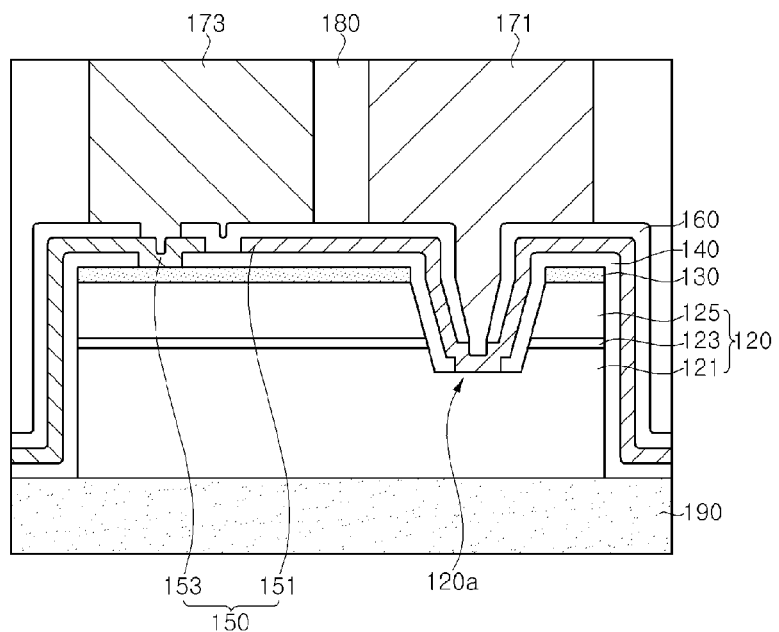

[Fig. 4]
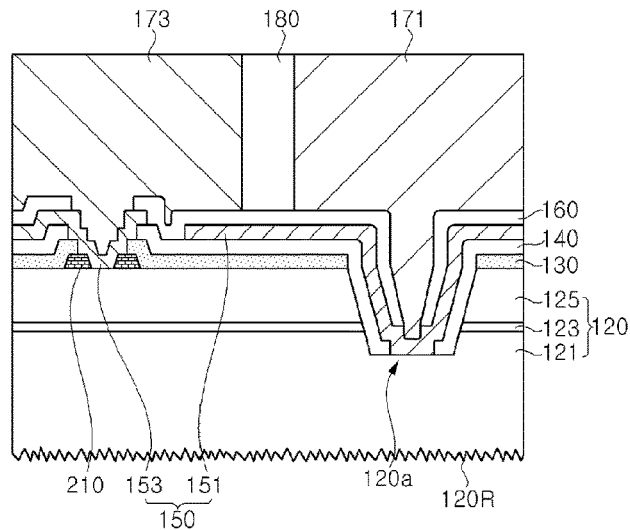
[Fig. 5]
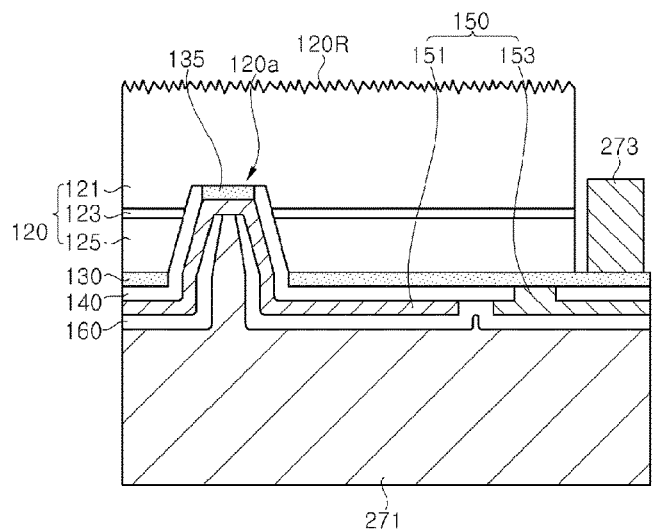
[Fig. 6]
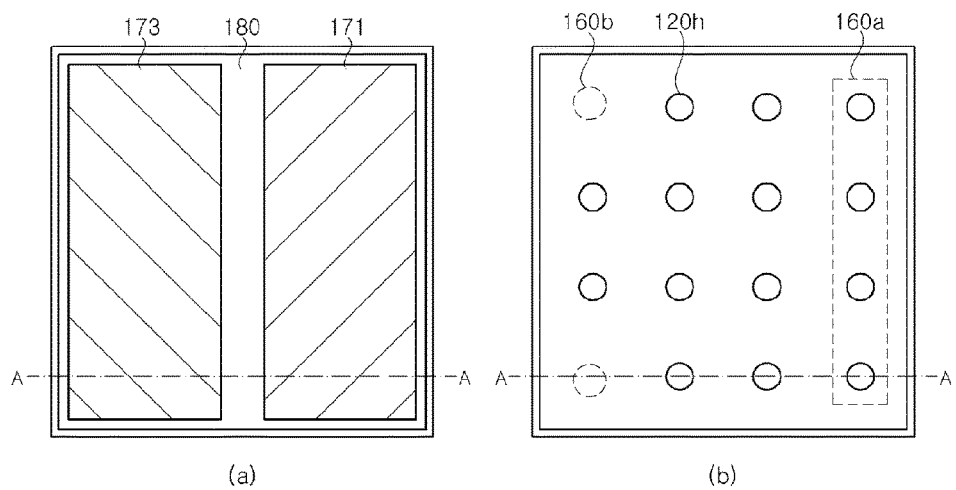

[Fig. 7]
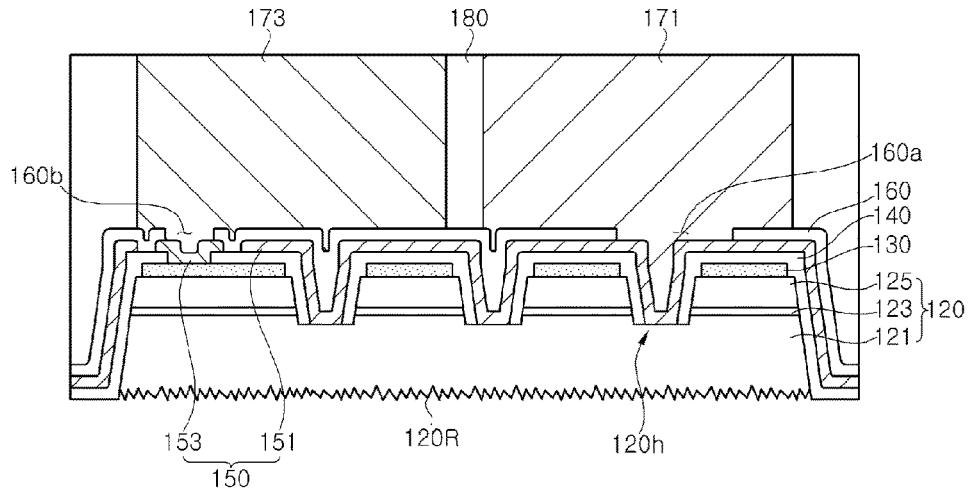
[Fig. 8]
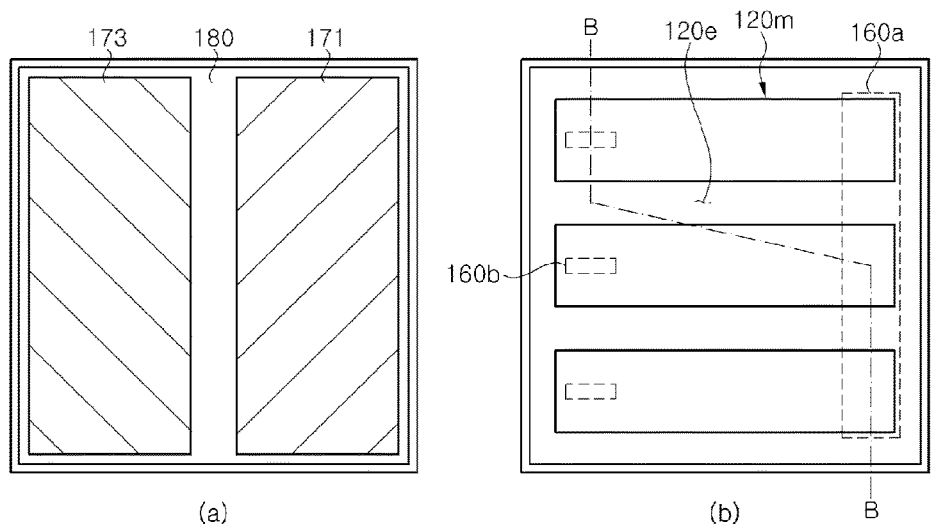
(a)          (b)
[Fig. 9]
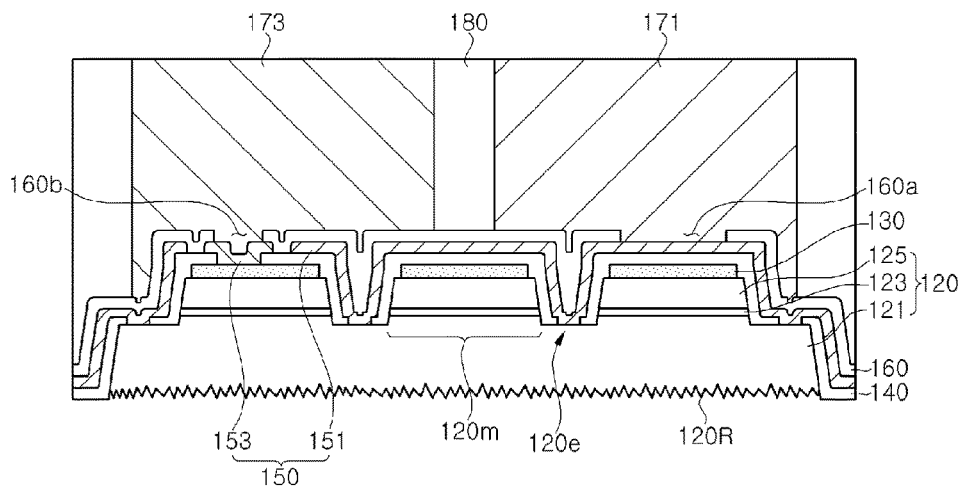

[Fig. 10]
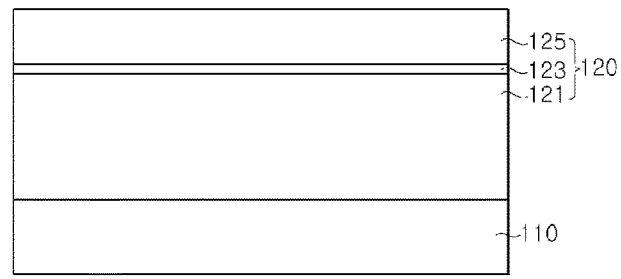
[Fig. 11]
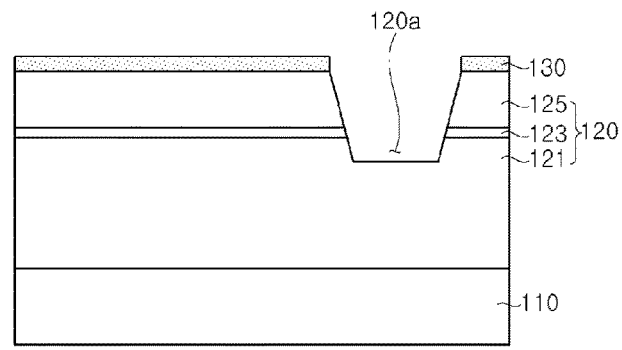
[Fig. 12]
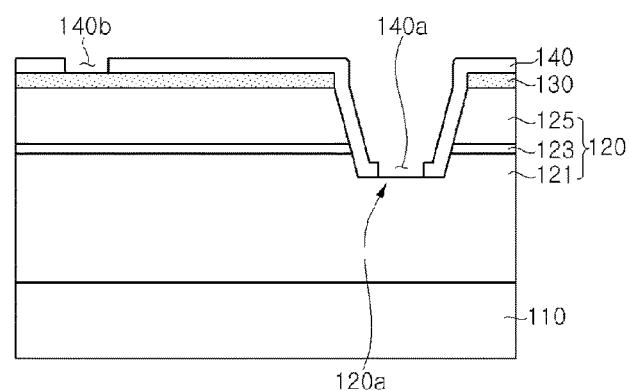
[Fig. 13]
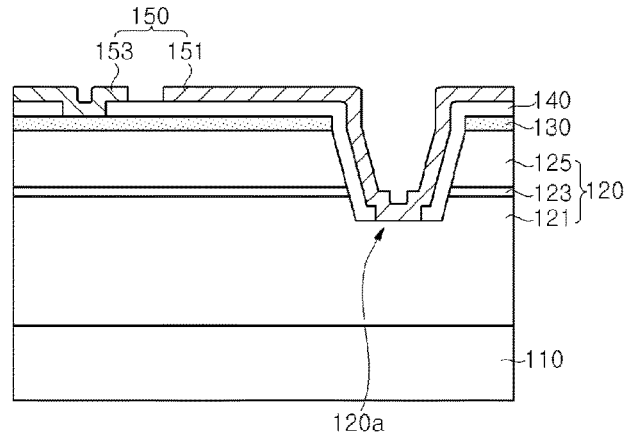

[Fig. 14]
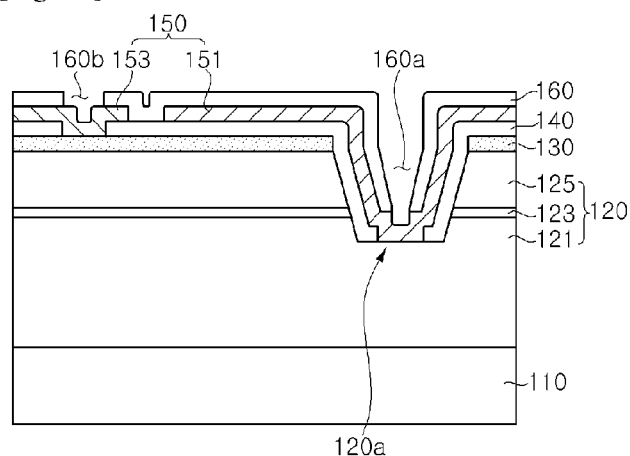
[Fig. 15]
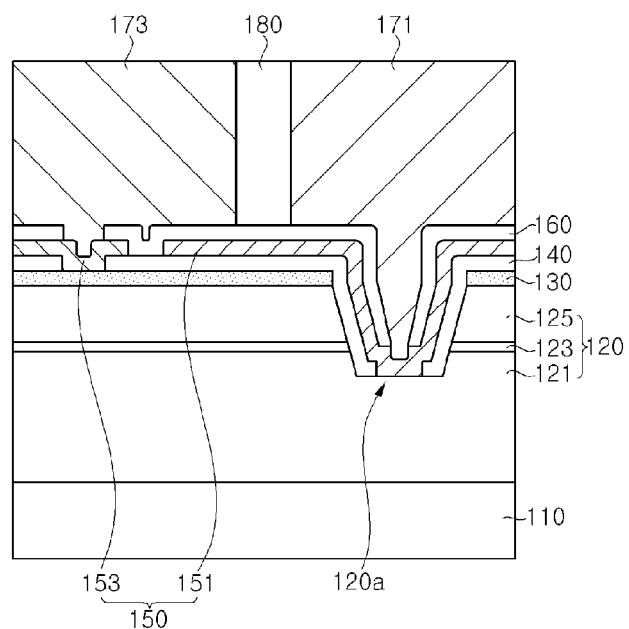

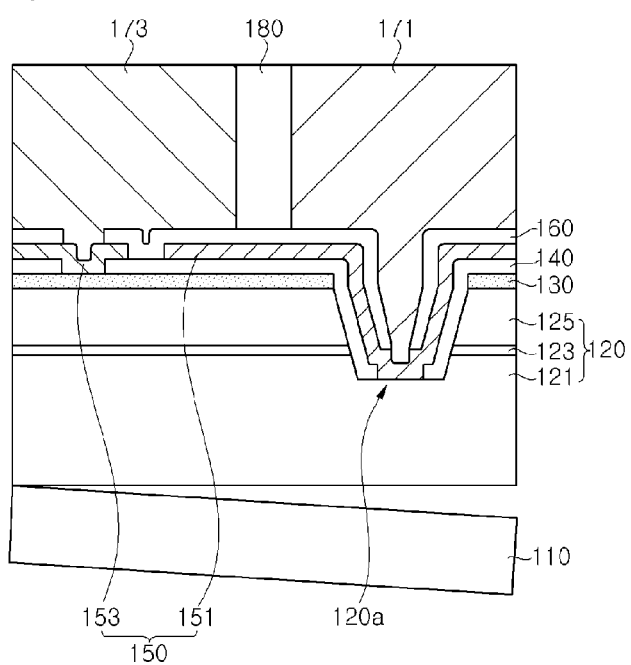
[Fig. 16]

ical and optical characteristics of the light emitting device.
LIGHT EMITTING DEVICE AND METHOD OF FABRICATING THE SAME

CROSS REFERENCE TO RELATED APPLICATION

This patent document is a 35 U.S.C. § 371 National Stage application of PCT Application No. PCT/KR2015/010874, filed on Oct. 15, 2015, which further claims the benefits and priority of prior Korean Patent Application No. 10-2014-0142576, filed on Oct. 21, 2014. The entire disclosures of the above applications are incorporated by reference in their entirety as part of this document.

TECHNICAL FIELD

The present disclosure relates to a light emitting device and a method of fabricating the same, and more particularly, to a light emitting device that exhibits excellent electrical and optical characteristics and has high reliability, and a method of fabricating the same.

BACKGROUND ART

Recently, with increasing need for small high output light emitting devices, demand for large flip-chip type or vertical type light emitting devices securing good heat dissipation efficiency has also be increased. In the flip-chip type or vertical type light emitting device, electrodes are directly joined to a secondary substrate, thereby providing better heat dissipation efficiency than a lateral type light emitting device. Thus, the flip-chip type or vertical type light emitting device can effectively transfer heat to the secondary substrate upon application of high current and thus can be suitably used for a high output light source.

In a typical flip-chip type or vertical type light emitting device, since a main light emitting plane is a surface of an n-type semiconductor layer on which a growth substrate resides, a structure capable of reflecting light towards the light emitting plane is formed on a p-type semiconductor layer. For this reason, an Ag electrode capable of forming ohmic contact with the p-type semiconductor layer while acting as a reflector is generally disposed on the p-type semiconductor layer.

However, the structure wherein such a reflective electrode is used as the p-type electrode has the following problems.

First, in formation of the reflective electrode, a metal layer is subjected to patterning through photolithography, which makes it difficult to cover the overall surface of the p-type semiconductor layer with Ag due to process margin thereof. Namely, an ohmic contact area between the p-type semiconductor layer and an Ag electrode is decreased. As a result, a current injection area of the light emitting device is decreased and light is not reflected in a region in which the reflective metal is not formed, thereby deteriorating luminous efficacy of the light emitting device.

Moreover, Ag atoms of the reflective electrode contacting the p-type semiconductor layer diffuse into the p-type semiconductor layer and act as impurities. Particularly, such Ag atoms can diffuse into the p-type semiconductor layer through defects (for example, dislocations) of the p-type semiconductor layer. The diffused atoms deteriorate crystallinity of the semiconductor layer while increasing a possibility of current leakage, thereby deteriorating electrical and other characteristics of the light emitting device.

Therefore, there is a need for a novel light emitting device exhibiting excellent electrical and optical characteristics.

DISCLOSURE OF INVENTION

Technical Problem

Exemplary embodiments provide a light emitting device that can reduce a possibility of current leakage to provide excellent electrical characteristics and can effectively reflect light emitted from a light emitting region to enhance optical characteristics, and a method of fabricating the same.

Solution to Problem

In accordance with one exemplary embodiment, a light emitting device includes: a light emitting structure including a first conductive type semiconductor layer, a second conductive type semiconductor layer disposed on the first conductive type semiconductor layer, an active layer disposed between the first and second conductive type semiconductor layers, and a partially exposed region of an upper surface of the first conductive type semiconductor layer; a transparent electrode disposed on the second conductive type semiconductor layer and forming ohmic contact with the second conductive type semiconductor layer; a first insulation layer covering the light emitting structure and the transparent electrode, and including a first opening and a second opening exposing the partially exposed region of the upper surface of the first conductive type semiconductor layer and a portion of the transparent electrode, respectively; a metal layer at least partially covering the first insulation layer and extending to an upper surface of the second conductive type semiconductor layer; a first electrode electrically connected to the first conductive type semiconductor layer; and a second electrode electrically connected to the transparent electrode.

With this structure, the light emitting device has improved electrical and optical characteristics.

A portion in which the transparent electrode, the first insulation layer and the metal layer are stacked may be an omnidirectional reflector.

The transparent electrode may include a conductive oxide, the insulation layer may include a silicon oxide or a silicon nitride, and the metal layer may include a light-reflective metal.

The transparent electrode may include indium tin oxide (ITO), the insulation layer may include $SiO_2$, and the metal layer may include Ag and/or Al.

The light emitting device may further include a contact electrode on the partially exposed region of the upper surface of the first conductive type semiconductor layer, wherein the contact electrode may be formed of the same material as the transparent electrode.

The metal layer may include a first metal layer forming ohmic contact with the first conductive type semiconductor layer through the first opening and extending to the upper surface of the second conductive type semiconductor layer, and a second metal layer contacting the transparent electrode through the second opening, and the first metal layer and the second metal layer may be separated from each other.

The light emitting device may further include a second insulation layer covering the metal layer, wherein the second insulation layer may include a third opening exposing the first metal layer and a fourth opening exposing the second metal layer.

The first and second electrodes may be disposed on the light emitting structure.

The light emitting device may further include an insulation unit at least partially covering side surfaces of the first electrode and the second electrode and disposed between the first and second electrodes.

The transparent electrode may cover an overall upper surface of the second conductive type semiconductor layer.

The first insulation layer and the metal layer may further cover at least a portion of a side surface of the light emitting structure.

The light emitting device may further include a wavelength conversion layer disposed under a lower surface of the light emitting structure.

The light emitting device may further include a second insulation layer covering the metal layer and including a third opening exposing a region corresponding to the first opening, wherein the first electrode may be disposed on the second insulation layer, the transparent electrode may include a region extending from one side surface of the light emitting structure and having an exposed surface, and the second electrode may be disposed on the exposed surface of the transparent electrode.

The partially exposed region of the upper surface of the first conductive type semiconductor layer may be formed in a hole shape formed through the second conductive type semiconductor layer and the active layer, and the light emitting structure may include at least one hole formed through the second conductive type semiconductor layer and the active layer.

The light emitting structure may include at least one mesa including the second conductive type semiconductor layer and the active layer, and the partially exposed region of the upper surface of the first conductive type semiconductor layer may be disposed around the mesa.

The first insulation layer may include a plurality of nano-rods separated from each other or a plurality of nano-holes separated from each other.

Advantageous Effects of Invention

According to exemplary embodiments, a light emitting device including an omnidirectional reflector in which a transparent electrode, an insulation layer, and a metal layer are stacked may be provided. In the light emitting device, the transparent electrode is interposed between the metal layer and the semiconductor layer to prevent metal atoms from diffusing from the metal layer into the semiconductor layer, thereby preventing deterioration in electrical characteristics of the light emitting device, while improving luminous efficacy of the light emitting device through reflection by the omnidirectional reflector.

BRIEF DESCRIPTION OF DRAWINGS

FIG. 1 is a sectional view of an exemplary light emitting device according to various embodiments.

FIG. 2 is a sectional view of an exemplary light emitting device according to various embodiments.

FIG. 3a is a sectional view of an exemplary light emitting device according to various embodiments.

FIG. 3b is a sectional view of an exemplary light emitting device according to various embodiments.

FIG. 4 is a sectional view of an exemplary light emitting device according to various embodiments.

FIG. 5 is a sectional view of an exemplary light emitting device according to various embodiments.

FIG. 6 and FIG. 7 are plan views and a sectional view of an exemplary light emitting device according to various embodiments.

FIG. 8 and FIG. 9 are plan views and a sectional view of an exemplary light emitting device according to various embodiments.

FIG. 10 to FIG. 16 are plan views and a sectional view illustrating an exemplary method of fabricating a light emitting device according to various embodiments.

MODE FOR THE INVENTION

Hereinafter, exemplary embodiments will be described in more detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be "directly disposed above" or "directly disposed on" the other element or layer or intervening elements or layers can be present. Throughout the specification, like reference numerals denote like elements having the same or similar functions.

FIG. 1 is a sectional view of an exemplary light emitting device according to various embodiments.

Referring to FIG. 1, the light emitting device includes a light emitting structure 120, a transparent electrode 130, a first insulation layer 140, and a metal layer 150. In addition, the light emitting device may further include a second insulation layer 160, a first electrode 171, a second electrode 173, and an insulation unit 180.

The light emitting structure 120 may include a first conductive type semiconductor layer 121, an active layer 123 disposed on the first conductive type semiconductor layer 121, and a second conductive type semiconductor layer 125 disposed on the active layer 123. The first conductive type semiconductor layer 121, the active layer 123 and the second conductive type semiconductor layer 125 may include a III-V-based compound semiconductor, for example, a nitride-based semiconductor such as (Al, Ga, In)N. The first conductive type semiconductor layer 121 may include n-type dopants (for example, Si) and the second conductive type semiconductor layer 125 may include p-type dopants (for example, Mg), or vice versa. The active layer 123 may have a multi-quantum well (MQW) structure.

The light emitting structure 120 may include a partially exposed region of an upper surface of the first conductive type semiconductor layer 121. The partially exposed region of the upper surface of the first conductive type semiconductor layer 121 may be formed by partially removing the second conductive type semiconductor layer 125 and the active layer 123, and the upper surface of the first conductive type semiconductor layer 121 may be partially exposed through a hole 120a formed through the second conductive type semiconductor layer 125 and the active layer 123, as shown in FIG. 1. The hole 120a may have an inclined side surface. However, it should be understood that the present disclosure is not limited thereto and the shape and location of the partially exposed region of the first conductive type semiconductor layer 121 may be changed in various ways.

As described below, the first conductive type semiconductor layer 121 may be electrically connected to the first electrode 171 through the hole 120a.

Further, the light emitting structure 120 may further include roughness 120R formed on the other surface thereof opposite one surface thereof on which the hole 120a is formed. The roughness 120R may be formed by dry etching, wet etching and/or electrochemical etching. For example, the roughness 120R may be formed by wet etching one surface of the light emitting structure in a solution containing at least one of KOH and NaOH, or may be formed by PEC etching. Alternatively, the roughness 120R may be formed by combination of dry etching and wet etching. The aforementioned methods for forming the roughness 120R are provided for illustration and various methods known to those skilled in the art may be used to form the roughness 120R on the surface of the light emitting structure 120. With the structure wherein the roughness 120R is formed on the surface of the light emitting structure 120, the light emitting device has improved extraction efficiency.

The transparent electrode 130 is disposed on the second conductive type semiconductor layer 125. Particularly, the transparent electrode 130 may contact an upper surface of the second conductive type semiconductor layer 125 to form ohmic contact therewith, and may cover the overall upper surface of the second conductive type semiconductor layer 125.

The transparent electrode 130 may include a conductive oxide such as ITO, ZnO, AZO, IZO, and the like, and particularly, in this exemplary embodiment, the transparent electrode 130 may be formed of ITO. When the second conductive type semiconductor layer 125 is a p-type conductive semiconductor layer, the transparent electrode 130 including ITO can form ohmic contact having low contact resistance between the transparent electrode 130 and the second conductive type semiconductor layer 125. The transparent electrode 130 may contact substantially an almost overall upper surface of the second conductive type semiconductor layer 125. In some embodiments, the transparent electrode 130 may contact the entirety of the upper surface of the second conductive type semiconductor layer 125. In this structure, when supplied to the light emitting device, electric current can be spread in the horizontal direction through the transparent electrode 130 and thus can be uniformly supplied to the entirety of the second conductive type semiconductor layer 125. Furthermore, since an outer periphery of the second conductive type semiconductor layer 125 is also covered by the transparent electrode 130, it is possible to minimize a separation distance D from a portion of the second conductive type semiconductor layer 125 to which electric current is directly supplied by the transparent electrode 130, to a portion of the first conductive type semiconductor layer 121, to which electric current is directly supplied by the first metal layer 151. With this structure, the light emitting device according to exemplary embodiments has low forward voltage ($V_f$) for operation.

The first insulation layer 140 partially covers the transparent electrode 130 and the light emitting structure 120. Further, the first insulation layer 140 may include a first opening that partially exposes the first conductive type semiconductor layer 121 and a second opening that partially exposes the transparent electrode 130.

As shown in FIG. 1, the first insulation layer 140 may partially cover an upper surface and a side surface of the transparent electrode 130 while partially exposing the transparent electrode 130. Further, the first insulation layer 140 may cover a side surface of the hole 120a and a portion of a bottom surface of the hole 120a such that the first conductive type semiconductor layer 121 is partially exposed through the hole 120a. That is, the first opening may be disposed at a location corresponding to the hole 120a. When the hole 120a has an inclined side surface, the first insulation layer 140 disposed on the side surface of the hole 120a can be more stably formed. In operation of the light emitting device, current can be supplied to the first and second conductive type semiconductor layers 121, 125 through the first and second openings of the first insulation layer 140.

The first insulation layer 140 may include an insulation material exhibiting light transmission, such as a Si oxide, Si nitride or $MgF_2$, and may be composed of a single layer or multiple layers. Particularly, in this embodiment, the first insulation layer 140 may include $SiO_2$.

Further, the first insulation layer 140 may have an index of refraction of 1.4 or less. For example, when the first insulation layer 140 includes $SiO_2$, the first insulation layer 140 may include a plurality of nano-rods and/or a plurality of nano-holes, which are formed of $SiO_2$. With the structure wherein the first insulation layer 140 includes the nano-rods and/or nano-holes, it is possible to realize a first insulation layer having a lower index of refraction than a typical single layer structure.

The metal layer 150 is dispose on the first insulation layer 140 and may at least partially cover the first insulation layer 140.

The metal layer 150 may include a first metal layer 151 and a second metal layer 153 insulated from each other. The first metal layer 151 may be disposed on an upper surface of the light emitting structure 120, on the side surface of the hole 120a, and on the bottom surface of the hole 120a to partially cover the first insulation layer 140, and may contact the first metal layer 151 and the first conductive type semiconductor layer 121 through the first opening of the first insulation layer 140 disposed on the bottom surface of the hole 120a. Here, the first metal layer 151 may contact the first conductive type semiconductor layer 121 to form ohmic contact therewith. The second metal layer 153 is separated from the first metal layer 151, may be disposed on the light emitting structure 120 to partially cover the first insulation layer 140, and may contact the transparent electrode 130 through the second opening of the first insulation layer 140 to be electrically connected to the transparent electrode 130.

The metal layer 150 may include a metal having electrical conductivity and optical reflectivity. For example, the metal layer 150 may include Ag and/or Al, and the like, and may be composed of a single layer or multiple layers. Particularly, in this embodiment, for a structure wherein the light emitting structure 120 emits light in the visible range, the metal layer 150 may include Ag, and for a structure wherein the light emitting structure 120 emits light in the ultraviolet range, the metal layer 150 may include Al.

Furthermore, when the metal layer 150 includes Ag, the metal layer 150 may further include a cover layer that covers an Ag layer so as to prevent diffusion of Ag. The cover layer may include a metal such as Au, Ni, Ti, Cr, and the like. When the metal layer 150 includes Al, the light emitting device may further include a bonding layer between an Al layer and the first insulation layer 140 in order to reinforce bonding strength between the metal layer 150 and the first insulation layer 140. The bonding layer may include a metal such as Ni, Pt, Cr, Ti, Rh, Pd, and the like.

With the structure wherein the metal layer 150 is disposed on the first insulation layer 140, the light emitting device according to this exemplary embodiment includes a stack structure in which the transparent electrode 130, the first insulation layer 140 and the metal layer 150 are stacked one above another. The stack structure in which the transparent electrode 130, the first insulation layer 140 and the metal layer 150 are stacked one above another may act as an omnidirectional reflector. For example, a stack structure including the transparent electrode 130 formed of ITO, the first insulation layer 140 formed of $SiO_2$ and the metal layer 150 formed of Ag can act as the omnidirectional reflector with respect to light in the visible range. In the light emitting device with this structure, light emitted from the light emitting structure 120 can be effectively reflected by the omnidirectional reflector.

Further, according to the exemplary embodiment, since the transparent electrode 130 is formed to cover substantially the overall upper surface of the second conductive type semiconductor layer 125, substantially the entirety of the upper surface of the second conductive type semiconductor layer 125 may be formed as an omnidirectional reflector. Accordingly, the light emitting device according to the exemplary embodiment allows more efficient reflection of light than a structure wherein a metallic reflective layer is formed on the p-type semiconductor layer.

Furthermore, instead of allowing direct contact between the metal layer 150 and the second conductive type semiconductor layer 125, the transparent electrode 130 and the first insulation layer 140 are interposed between the metal layer 150 and the second conductive type semiconductor layer 125, thereby preventing diffusion of metal atoms (for example, Ag) from the metal layer 150 to the second conductive type semiconductor layer 125. That is, the transparent electrode 130 may act as a diffusion barrier with respect to the metal atoms. With this structure, the light emitting device can prevent deterioration in crystallinity of the semiconductor layer or formation of a current leakage path therein due to diffusion of the metal atoms into the second conductive type semiconductor layer 125.

Furthermore, the metal layer 150 is also disposed on the side surface of the hole 120a and reflects light that can be lost through the side surface of the hole 120a, thereby improving luminous efficacy of the light emitting device.

The second insulation layer 160 may cover at least a portion of the metal layer 150 and include a third opening that partially exposes the first metal layer 151 and a fourth opening that partially exposes the second metal layer 153.

The third opening may be disposed at a location corresponding to the hole 120a. The fourth opening may be disposed at a side opposite the location of the third opening. For example, as shown in FIG. 1, when the third opening is disposed near one side of the light emitting structure 120, the fourth opening may be disposed near the other side of the light emitting structure 120.

An external power source may be electrically connected to the first and second metal layers 151, 153 through the third and fourth openings of the second insulation layer 160 to supply electric current to the light emitting structure 120.

The second insulation layer 160 may include an insulation material, for example, $SiO_2$, $SiN_x$, $MgF_2$, and the like. Furthermore, the second insulation layer 160 may be composed of multiple layers and may include a distributed Bragg reflector in which insulation materials having different indexes of refraction are alternately stacked one above another. The structure wherein the second insulation layer 160 includes the distributed Bragg reflector secondarily reflects light, which has passed through the omnidirectional reflector instead of being reflected thereby, thereby improving luminous efficacy of the light emitting device.

The first electrode 171 and the second electrode 173 may be disposed on the light emitting structure 120 and partially cover the second insulation layer 160.

The first electrode 171 and the second electrode 173 are separated from each other and may be electrically connected to the first metal layer 151 and the second metal layer 153 through the third opening and the fourth opening of the second insulation layer 160. With this structure, the first electrode 171 and the second electrode 173 may be connected to an external power source to supply electric current to the light emitting structure 120.

The first electrode 171 and the second electrode 173 may be composed of a single layer or multiple layers, and may include an electrically conductive material. For example, each of the first electrode 171 and the second electrode 173 may include Au, Ti, Ni, Al, Ag, and the like.

Each of the first electrode 171 and the second electrode 173 may have a thickness of several dozens of micrometers or more, for example, about 70 μm to 80 μm. With the electrodes 171, 173 within this thickness range, the light emitting device per se can be used as a chip scale package. Further, at least one side surface of each of the first electrode 171 and the second electrode 173 may be generally parallel to the side surface of the light emitting structure 120. However, it should be understood that the present disclosure is not limited thereto and other implementations are possible.

The insulation unit 180 may at least partially cover side surfaces of the first electrode 171 and the second electrode 173, and particularly, may be interposed between the first electrode 171 and the second electrode 173. Further, the first electrode 171 and the second electrode 173 may be exposed to an upper surface of the insulation unit 180, and the upper surface of the insulation unit 180 may be substantially flush with upper surfaces of the first electrode 171 and the second electrode 173. The insulation unit 180 serves to support the first and second electrodes 171, 173 and may be disposed between the first and second electrodes 171, 173 to effectively insulate these electrodes 171, 173 from each other.

The insulation unit 180 may include an insulation polymer and/or an insulation ceramic, for example, epoxy molding compound (EMC), Si resin, and the like. Further, the insulation unit 180 may include light reflective and light scattering particles such as $TiO_2$ particles.

In other exemplary embodiments, the insulation unit 180 may further cover at least a portion of the side surface of the light emitting structure 120. In these exemplary embodiments, a light emission angle from the light emitting structure 120 can be changed. For example, in the structure wherein the insulation unit 180 further covers the side surface of the light emitting structure 120, some of light emitted from the side surface of the light emitting structure 120 can be reflected upwards. In this way, it is possible to adjust the light emission angle of the light emitting device by adjusting the region in which the insulation unit 180 is disposed.

According to the exemplary embodiments, the transparent electrode 130 contacts substantially the overall upper surface of the second conductive type semiconductor layer 125, so that electric current supplied to the light emitting device can uniformly spread in the horizontal direction through the transparent electrode 130. Furthermore, since the transparent electrode 130 also covers the outer periphery of the second conductive type semiconductor layer 125, it is possible to minimize a separation distance D from a portion of the second conductive type semiconductor layer 125, to which electric current is directly supplied by the transparent electrode 130, to a portion of the first conductive type semiconductor layer 121, to which electric current is directly supplied by the first metal layer 151. With this structure, the light emitting device according to exemplary embodiments has low forward voltage ($V_f$) for operation.

FIG. 2 is a sectional view of an exemplary light emitting device according to various embodiments.

Unlike the light emitting device of FIG. 1, the light emitting device shown in FIG. 2 further includes a contact electrode 135. Hereinafter, the different features of the light emitting device according to the embodiment shown in FIG. 2 will be mainly described, and detailed descriptions of the same components as those of the light emitting device according to the above exemplary embodiment are omitted.

Referring to FIG. 2, the light emitting device according to this exemplary embodiment includes a light emitting structure 120, a transparent electrode 130, a first insulation layer 140, a metal layer 150, and a contact electrode 135. In addition, the light emitting device may further include a second insulation layer 160, a first electrode 171, a second electrode 173, and an insulation unit 180.

The contact electrode 135 may be disposed on an exposed region of the first conductive type semiconductor layer 121, that is, on a bottom surface of the hole 120a. Here, the first metal layer 151 may contact an upper surface of the contact electrode 135 to be electrically connected thereto.

The contact electrode 135 may contact the first conductive type semiconductor layer 121 to form ohmic contact therewith. The contact electrode 135 may include a conductive material such as ITO, ZnO, AZO, IZO, and the like, and particularly, in this exemplary embodiment, the contact electrode 135 may be formed of ITO. The contact electrode 135 may be formed of substantially the same material as the transparent electrode 130 and may be formed simultaneously with the transparent electrode 130 in fabrication of the light emitting device.

In the structure wherein the contact electrode 135 including a conductive oxide such as ITO is formed on the exposed region of the first conductive type semiconductor layer 121, the metal layer 150 does not directly contact the first conductive type semiconductor layer 121. Thus, the contact electrode 135 can prevent diffusion of metal atoms (for example, Ag) from the metal layer 150 into the first conductive type semiconductor layer 121, and can prevent current leakage or deterioration in crystallinity of the first conductive type semiconductor layer 121.

Furthermore, by the contact electrode 135, a separation distance from a contact portion between the first conductive type semiconductor layer 121 and the contact electrode 135 to a contact portion between the second conductive type semiconductor layer 125 and the transparent electrode 130 can be further reduced. Accordingly, the light emitting device according to this exemplary embodiment can be driven by a relatively low forward voltage.

FIG. 3a is a sectional view of an exemplary light emitting device according to a various embodiments.

Unlike the light emitting device shown in FIG. 1, the light emitting device shown in FIG. 3a further includes a wavelength conversion layer 190. Hereinafter, the different features of the light emitting device according to the embodiment shown in FIG. 3a will be mainly described, and detailed descriptions of the same components as those of the light emitting device according to the above exemplary embodiment are omitted.

Referring to FIG. 3a, the light emitting device according to this exemplary embodiment includes a light emitting structure 120, a transparent electrode 130, a first insulation layer 140, a metal layer 150, and a wavelength conversion layer 190. In addition, the light emitting device may further include a second insulation layer 160, a first electrode 171, a second electrode 173, and an insulation unit 180.

The wavelength conversion layer 190 may be disposed on a lower surface of the light emitting structure 120.

The wavelength conversion layer 190 serves to convert wavelengths of light emitted from the light emitting structure 120 such that the light emitting device can emit light in a desired wavelength band. The wavelength conversion layer 190 may include phosphors and a bearing member containing the phosphors. The phosphors may include various phosphors well known to those skilled in the art, and may include at least one of garnet phosphors, aluminate phosphors, sulfate phosphors, oxy-nitride phosphors, nitride phosphors, fluoride phosphors, and silicate phosphors. The bearing member may also be formed of a material well known to those skilled in the art, for example, polymer resins such as epoxy resins or acrylic resins, or silicone resins. The wavelength conversion layer 190 may be composed of a single layer or multiple layers.

Although the wavelength conversion layer 190 is formed to cover the lower surface of the light emitting structure 120 in FIG. 3a, the present disclosure is not limited thereto and other implementations are possible. The wavelength conversion layer 190 may further cover at least a portion of the side surface of the light emitting device. In this exemplary embodiment, the wavelength conversion layer 190 may further cover the side surface of the light emitting structure 120 while covering the electrodes 171, 173 or a portion of the side surface of the insulation unit 180.

With the structure wherein the light emitting device further includes the wavelength conversion layer 190, the light emitting device according to this exemplary embodiment per se can be used as a white light chip scale package. Accordingly, a package of a white light emitting device can be provided without a separate component for constituting a package of the light emitting device, thereby enabling reduction in size of the light emitting device package.

FIG. 3b is a sectional view of an exemplary light emitting device according to various embodiments.

The light emitting device of FIG. 3b is different from the light emitting device of FIG. 3a in terms of structures of the first insulation layer 140, the metal layer 150, the second insulation layer 160 and the insulation unit 180. Hereinafter, the different features of the light emitting device according to the embodiment shown in FIG. 3b will be mainly described, and detailed descriptions of the same components as those of the light emitting device according to the above exemplary embodiment are omitted.

Referring to FIG. 3b, the light emitting device according to this exemplary embodiment includes a light emitting structure 120, a transparent electrode 130, a first insulation layer 140, a metal layer 150, and a wavelength conversion layer 190. In addition, the light emitting device may further include a second insulation layer 160, a first electrode 171, a second electrode 173, and an insulation unit 180.

Unlike the light emitting device of FIG. 3a, in the light emitting device of FIG. 3b, the first insulation layer 140 may further cover a side surface of the light emitting structure 120, and a portion of the first insulation layer 140 may contact the wavelength conversion layer 190. Further, the metal layer 150 and the second insulation layer 160 may be disposed on the first insulation layer 140 covering the side surface of the light emitting structure 120.

With this structure, the semiconductor layers exposed to the side surface of the light emitting structure 120 can be more effectively protected from an external environment. Furthermore, the metal layer 150 is also disposed on the side surface of the light emitting structure 120 and reflects light traveling towards the side surface of the light emitting structure 12, thereby improving luminous efficacy of the light emitting device.

FIG. 4 is a sectional view of an exemplary light emitting device according to various embodiments.

Unlike the light emitting device of FIG. 1, the light emitting device shown in FIG. 4 further includes a current blocking layer 210. Hereinafter, the different features of the light emitting device according to the embodiment shown in FIG. 4 will be mainly described, and detailed descriptions of the same components as those of the light emitting device according to the above exemplary embodiment are omitted.

Referring to FIG. 4, the light emitting device according to this exemplary embodiment includes a light emitting structure 120, a transparent electrode 130, a first insulation layer 140, a metal layer 150, and a current blocking layer 210. In addition, the light emitting device may further include a second insulation layer 160, a first electrode 171, a second electrode 173, and an insulation unit 180.

The current blocking layer 210 may be disposed on one region of the second conductive type semiconductor layer 125. For example, the current blocking layer 210 may be disposed at a location corresponding to a contact portion between a second metal layer 153 and the transparent electrode 130. In addition, the current blocking layer 210 may include a through-hole formed in a thickness direction thereof to expose an upper surface of the second conductive type semiconductor layer 125. The current blocking layer 210 may have an inclined side surface.

The through-hole may have a circular shape in plan view and be generally formed at a central portion of the current blocking layer 210. However, it should be understood that the present disclosure is not limited thereto and the through-hole may have a polygonal shape and the current blocking layer may include a plurality of throughholes.

The transparent electrode 130 may at least partially cover the upper surface of the second conductive type semiconductor layer 125 and the current blocking layer 210, and may have an opening through which the through-hole of the current blocking layer 210 is exposed.

The current blocking layer 210 can prevent current crowding due to direct supply of electric current through the electrodes to the semiconductor layers. Accordingly, the current blocking layer 210 may include an insulation material and be composed of a single layer or multiple layers. For example, the current blocking layer 210 may include $SiO_2$, $SiN_x$, $MgF_2$, $ZrO_2$, $Al_2O_3$, and the like, and may include a distributed Bragg reflector in which insulation materials having different indexes of refraction are alternately stacked one above another. Accordingly, the current blocking layer 210 may exhibit light transmission or light reflectivity.

For example, in the structure wherein the current blocking layer 210 includes a distributed Bragg reflector to provide light reflectivity, the distributed Bragg reflector prevents light from traveling towards the second metal layer 153, thereby preventing light absorption or light loss by the second metal layer 153. Accordingly, the material and thickness of the distributed Bragg reflector can be determined so as to reflect light in a desired wavelength band depending upon peak wavelengths of light emitted from the active layer 123.

In this exemplary embodiment, the transparent electrode 130 may be formed in a shape corresponding to a contour of the upper surface of the second conductive type semiconductor layer 125 to cover the upper surface of the second conductive type semiconductor layer 125, and may also cover an outer side surface and a portion of the upper surface of the current blocking layer 210. With this structure, the transparent electrode 130 is not formed on the remaining portion of the upper surface of the current blocking layer 210 and the through-hole. The opening of the transparent electrode 130 may have a shape corresponding to the shape of through-hole. The opening may have a greater diameter than the through hole 131.

Further, the second metal layer 153 may contact the second conductive type semiconductor layer 125 through the opening of the transparent electrode 130 and the through-hole of the current blocking layer 210, and may contact the transparent electrode 130 to be electrically connected thereto. In this exemplary embodiment, the second metal layer 153 may form Schottky contact with the second conductive type semiconductor layer 125 and ohmic contact with the transparent electrode 130. The second metal layer 153 disposed on the current blocking layer 210 may be formed along surfaces of the second conductive type semiconductor layer 125, the current blocking layer 210, the transparent electrode 130, and the first insulation layer 140.

When supplied through the second metal layer 153, electric current can be effectively spread through the transparent electrode 130 in the horizontal direction and can be prevented from crowding in the vertical direction by the current blocking layer 210.

FIG. 5 is a sectional view of an exemplary light emitting device according to various embodiments.

The light emitting device shown in FIG. 5 is different from the light emitting device shown in FIG. 2 in terms of structures of the first insulation layer 140, the metal layer 150, the second insulation layer 160, the first electrode 271 and the second electrode 273. Hereinafter, the different features of the light emitting device according to the embodiment shown in FIG. 5 will be mainly described, and detailed descriptions of the same components as those of the light emitting device according to the above exemplary embodiment are omitted.

Referring to FIG. 5, the light emitting device according to this exemplary embodiment includes a light emitting structure 120, a transparent electrode 130, a first insulation layer 140, and a metal layer 150. In addition, the light emitting device may further include a second insulation layer 160, a first electrode 271, a second electrode 273, and an insulation unit 180.

The transparent electrode 130 may include an exposed region extending from one side surface of the light emitting structure 120. In this exemplary embodiment, the second electrode 273 may be disposed on the exposed region and electrically connected to the second conductive type semiconductor layer 125.

The first electrode 273 may be formed to cover the second insulation layer 160 while entirely supporting one surface of the light emitting structure 120. That is, as shown in FIG. 5, the first electrode 273 is electrically connected to the first conductive type semiconductor layer 121 through the hole 120a and is disposed at a lower portion of the light emitting device to support the light emitting structure 120.

Accordingly, a vertical light emitting device in which the first electrode 271 and the second electrode 273 are disposed at upper and lower portions thereof is provided.

FIG. 6 and FIG. 7 are plan views and a sectional view of an exemplary light emitting device according to various embodiments.

The light emitting structure 120 of the light emitting device according to this exemplary embodiment has a different structure than that of the light emitting device shown in FIG. 1. Thus, other remaining components of the light emitting structure have a different structural relationship, and the different features of the light emitting structure will be mainly described in more detail. Detailed descriptions of the same components as those of the light emitting device according to the above exemplary embodiment are omitted.

FIG. 6(a) is a plan view of the light emitting device according to this exemplary embodiment, FIG. 6(b) is a plan view illustrating locations of holes 120h, a third opening 160a and a fourth opening 160b, and FIG. 7 is a sectional view taken along line A-A of FIGS. 6(a) and (b).

Referring to FIGS. 6 and 7, the light emitting device according to this exemplary embodiment includes a light emitting structure 120 that includes a first conductive type semiconductor layer 121, an active layer 123 and a second conductive type semiconductor layer 125, a transparent electrode 130, a first insulation layer 140, and a metal layer 150. In addition, the light emitting device may further include a second insulation layer 160, a first electrode 171, a second electrode 173, and an insulation unit 180.

The light emitting structure 120 may include a partially exposed region of the first conductive type semiconductor layer 121 formed by partially removing the second conductive type semiconductor layer 125 and the active layer 123. For example, as shown in the drawings, the light emitting structure 120 may include one or more holes 120h formed through the second conductive type semiconductor layer 125 and the active layer 123 to expose the first conductive type semiconductor layer 121 therethrough. The holes 120h may be regularly arranged over the light emitting structure 120. However, it should be understood that the present disclosure is not limited thereto and arrangement and the number of holes 120h may be changed in various ways.

The exposed region of the first conductive type semiconductor layer 121 is not limited to the shape corresponding to the shapes of the holes 120h. For example, the exposed region of the first conductive type semiconductor layer 121 may have a line shape or a combined shape of hole and line shapes.

The transparent electrode 130 is disposed on the second conductive type semiconductor layer 125 to form ohmic contact therewith. The transparent electrode 130 may generally cover an upper surface of the second conductive type semiconductor layer 125. In some embodiments, the transparent electrode 130 may substantially completely cover the upper surface of the second conductive type semiconductor layer 125. With this structure, the light emitting device enables uniform current supply to the entirety of the light emitting structure 120, thereby improving current spreading efficiency.

The first insulation layer 160 may partially cover an upper surface of the light emitting structure 120 and the transparent electrode 130. The first insulation layer 140 may cover side surfaces of the plural holes 120h and may include first openings that partially expose the first conductive type semiconductor layer 121 on bottom surfaces of the holes 120h. Accordingly, the first openings may be disposed at locations corresponding to the plural holes 120h. Further, the first insulation layer 140 may include a second opening that partially exposes the transparent electrode 130. Furthermore, the first insulation layer 140 may cover a side surface of at least a portion of the light emitting structure 120.

The metal layer 150 may partially cover the first insulation layer 140 and may also be formed on the first insulation layer 140 that covers the side surface of the light emitting structure 120.

The metal layer 150 may include a first metal layer 151 and a second metal layer 153. The first metal layer 151 may form ohmic contact with the first conductive type semiconductor layer 121 through the plural holes 120h and the first openings, and the second metal layer 153 may be electrically connected to the transparent electrode 130 through the second opening. The metal layer 150 may be formed to cover substantially the entirety of the first insulation layer 140 excluding a region which separates the first metal layer 151 and the second metal layer 153 from each other.

A region in which the transparent electrode 130, the first insulation layer 140 and the metal layer 150 are stacked may act as an omnidirectional reflector. For example, a stack structure including the transparent electrode 130 formed of ITO, the first insulation layer 140 formed of $SiO_2$ and the metal layer 150 formed of Ag can act as the omnidirectional reflector with respect to light in the visible range. In the light emitting device with this structure, light emitted from the light emitting structure 120 can be effectively reflected by the omnidirectional reflector.

With the structure wherein the structure acting as the omnidirectional reflector is formed to cover the entirety of the light emitting structure 120, the light emitting device has improved luminous efficacy.

The second insulation layer 160 may partially cover the metal layer 150 and include a third opening 160a that partially exposes the metal layer 150 and a fourth opening 160b that partially exposes the transparent electrode 130. The fourth opening 160b may be formed at a location corresponding to the second opening of the first insulation layer 140.

Each of the third and fourth openings 160a, 160b may be formed singularly or in plural. Further, as shown in FIG. 6(b), when the third opening 160a is disposed near one side of the light emitting device, the fourth opening 160b may be disposed near the other side of the light emitting device.

The first electrode 171 and the second electrode 173 may be disposed on the second insulation layer 160. Further, the first electrode 171 may be disposed on the third opening 160a to contact the metal layer 150, and the second electrode 173 may be disposed on the fourth opening 160b to contact the transparent electrode 130.

The insulation unit 180 may at least partially cover side surfaces of the first electrode 171 and the second electrode 173, and particularly, may be interposed between the first electrode 171 and the second electrode 173. Further, the first electrode 171 and the second electrode 173 may be exposed to an upper surface of the insulation unit 180, and the upper surface of the insulation unit 180 may be substantially flush with upper surfaces of the first electrode 171 and the second electrode 173.

FIG. 8 and FIG. 9 are plan views and a sectional view of an exemplary light emitting device according to various embodiments.

The light emitting structure 120 of the light emitting device according to this exemplary embodiment has a different structure than that of the light emitting device shown in FIGS. 6 and 7. Thus, other remaining components of the light emitting structure have a different structural relationship, and the different features of the light emitting structure will be mainly described in more detail. Detailed descriptions of the same components as those of the light emitting device according to the above exemplary embodiment are omitted.

FIG. 8(a) is a plan view of the light emitting device according to this exemplary embodiment, FIG. 8(b) is a plan view illustrating locations of holes 120h, a third opening 160a and a fourth opening 160b, and FIG. 9 is a sectional view taken along line A-A of FIGS. 8(a) and (b).

Referring to FIGS. 8 and 9, the light emitting device according to this exemplary embodiment includes a light emitting structure 120 that includes a first conductive type semiconductor layer 121, an active layer 123 and a second conductive type semiconductor layer 125, a transparent electrode 130, a first insulation layer 140, and a metal layer 150. In addition, the light emitting device may further include a second insulation layer 160, a first electrode 171, a second electrode 173, and an insulation unit 180.

The light emitting structure 120 may include at least one mesa 120, which includes the second conductive type semiconductor layer 125 and the active layer 123. The light emitting structure 120 may include a plurality of mesas 120m, as shown in the drawings. The plural mesas 120m may have an elongated shape extending in the same direction and be arranged parallel to each other.

An exposed region 120e of the first conductive type semiconductor layer 121 may be disposed around the mesas 120m to be parallel to, for example, longer sides of the mesas 120m.

The transparent electrode 130 is disposed on the mesas 120m to form ohmic contact with the second conductive type semiconductor layer 125. The transparent electrode 130 may generally cover an upper surface of the second conductive type semiconductor layer 125. In some exemplary embodiments, the transparent electrode 130 may substantially completely cover the upper surface of the second conductive type semiconductor layer 125. With this structure, the light emitting device enables uniform current supply to the entirety of the light emitting structure 120, thereby improving current spreading efficiency.

The first insulation layer 160 may partially cover an upper surface of the light emitting structure 120 and the transparent electrode 130. The first insulation layer 140 may cover side surfaces of the mesas 120m, and may include first openings that expose a portion of the first conductive type semiconductor layer 121 in the exposed region 120e of the first conductive type semiconductor layer 121. Accordingly, the first openings may be disposed corresponding to the location of the exposed region 120e of the first conductive type semiconductor layer 121. Further, the first insulation layer 140 may include a second opening that partially exposes the transparent electrode 130. The first insulation layer 140 may further cover a side surface of at least a portion of the light emitting structure 120.

The metal layer 150 may partially cover the first insulation layer 140 and may also be formed on the first insulation layer 140 that covers the side surface of the light emitting structure 120.

The metal layer 150 may include a first metal layer 151 and a second metal layer 153. The first metal layer 151 may form ohmic contact with the first conductive type semiconductor layer 121 through the first openings and the exposed region 120e of the first conductive type semiconductor layer 121, and the second metal layer 153 may be electrically connected to the transparent electrode 130 through the second opening. The metal layer 150 may be formed to cover substantially the entirety of the first insulation layer 140 excluding a region which separates the first metal layer 151 and the second metal layer 153 from each other.

A region in which the transparent electrode 130, the first insulation layer 140 and the metal layer 150 are stacked may act as an omnidirectional reflector. For example, a stack structure including the transparent electrode 130 formed of ITO, the first insulation layer 140 formed of $SiO_2$ and the metal layer 150 formed of Ag can act as the omnidirectional reflector with respect to light in the visible range. In the light emitting device with this structure, light emitted from the light emitting structure 120 can be effectively reflected by the omnidirectional reflector.

As the structure acting as the omnidirectional reflector is formed to cover the entirety of the light emitting structure 120, the light emitting device has improved luminous efficacy.

The second insulation layer 160 may cover a portion of the metal layer 150 and include a third opening 160a that partially exposes the metal layer 150 and a fourth opening 160b that partially exposes the transparent electrode 130. The fourth opening 160b may be formed at a location corresponding to the second opening of the first insulation layer 140.

Each of the third and fourth openings 160a, 160b may be formed singularly or in plural. Further, as shown in FIG. 6(b), when the third opening 160a is disposed near one side of the light emitting device, the fourth opening 160b may be disposed on the mesas 120m near the other side of the light emitting device.

The first electrode 171 and the second electrode 173 may be disposed on the second insulation layer 160. Further, the first electrode 171 may be disposed on the third opening 160a to contact the metal layer 150, and the second electrode 173 may be disposed on the fourth opening 160b to contact the transparent electrode 130.

The insulation unit 180 may at least partially cover side surfaces of the first electrode 171 and the second electrode 173, and particularly, may be interposed between the first electrode 171 and the second electrode 173. Further, the first electrode 171 and the second electrode 173 may be exposed to an upper surface of the insulation unit 180, and the upper surface of the insulation unit 180 may be substantially flush with upper surfaces of the first electrode 171 and the second electrode 173.

The structures of the light emitting devices according to the exemplary embodiment of FIG. 6 to FIG. 9 enables uniform current spreading in the horizontal direction, and can provide improved luminous efficacy through effective reflection of light by the omnidirectional reflector formed throughout the light emitting structure 120. Accordingly, the structures of the light emitting devices according to the above exemplary embodiments can secure high luminous efficacy when applied to a large light emitting device.

FIG. 10 to FIG. 16 are plan views and a sectional view illustrating an exemplary method of fabricating a light emitting device according to various embodiments. The method according to this exemplary embodiment provides a light emitting device according to the exemplary embodiments described above, and detailed description of the same components are omitted.

First, referring to FIG. 10, a light emitting structure 120 including a first conductive type semiconductor layer 121, an active layer 123 and a second conductive type semiconductor layer 125 are grown on a growth substrate 110.

As for the growth substrate 110, any substrate may be used so long as the substrate allows growth of the light emitting structure 120 thereon, and may include, for example, a sapphire substrate, a silicon carbide substrate, a silicon substrate, a gallium nitride substrate, an aluminum nitride substrate, and the like. In this exemplary embodiment, the growth substrate 110 may be a patterned sapphire substrate (PSS).

The first conductive type semiconductor layer 121, the active layer 123, and the second conductive type semiconductor layer 125 may be sequentially grown to form the light emitting structure. The light emitting structure 120 may include nitride semiconductors and may be formed by a typical semiconductor growth method, such as MOCVD, HYPE, MBE, and the like, which are known to those skilled in the art. In addition, a buffer layer (not shown) may be formed on the growth substrate 110 before growth of the first conductive type semiconductor layer 121.

The light emitting structure 120 may be grown on the growth substrate 110 to be provided in the form of a wafer. Accordingly, the method of fabricating a light emitting device according to this exemplary embodiment may provide a plurality of light emitting devices. The method according to this exemplary embodiment will be described with reference to a single light emitting device.

Next, referring to FIG. 11, at least one hole 120a is formed to expose a portion of the first conductive type semiconductor layer 121 by partially removing the second conductive type semiconductor layer 125 and the active layer 123, and a transparent electrode 130 is formed on the second conductive type semiconductor layer 125. The hole 120a and the transparent electrode 130 may be formed by any sequence instead of being limited to a particular sequence.

The at least one hole 120a may be formed by a photolithography and etching process. In this exemplary embodiment, the hole 120a may be formed to have an inclined side surface through photoresist reflow. Although only a single hole 120a is illustrated in this exemplary embodiment, the hole 120a may be provided in plural.

The transparent electrode 130 may be formed by deposition and patterning of a conductive oxide such as ITO. The transparent electrode 130 may be formed by a well-known deposition process, such as CVD or E-beam evaporation, and a well-known patterning process such as photolithography and etching, lift-off, and the like.

When the hole 120a is formed after formation of the transparent electrode 130 hole 120a, the transparent electrode 130, the second conductive type semiconductor layer 125 and the active layer 123 may be removed by the same etching process. In this case, a side surface of the transparent electrode 130 becomes generally parallel to the side surface of the hole 120a, so that the transparent electrode 130 substantially covers an overall upper surface of the second conductive type semiconductor layer 125. However, it should be understood that the present disclosure is not limited thereto and other implementations are possible.

When the fabricated light emitting device further includes a contact electrode 135, the contact electrode 135 may be formed of the same material as the transparent electrode 130 by the same process, and may be formed on a region of the first conductive type semiconductor layer 121 exposed through the hole 120a.

Referring to FIG. 12, a first insulation layer 140 is formed to partially cover the light emitting structure 120 and the transparent electrode 130.

The first insulation layer 140 may be formed by deposition of an insulation material such as $SiO_2$, and may be subjected to patterning to include a first opening 140a and a second opening 140b through lift-off or etching. The first opening 140a is formed at a location corresponding to the hole 120a, and particularly, the first insulation layer 140 may cover the side surface of the hole 120a. The second opening 140b partially exposes the transparent electrode 130 and the location of the second opening 140b is determined depending upon a region in which a second electrode 173 will be formed by a process described below.

The first insulation layer 140 may also be formed to further cover a side surface of the light emitting structure 120.

Next, referring to FIG. 13, a metal layer 150 is formed to partially cover the first insulation layer 140.

The metal layer 150 may be formed by plating and deposition, and may be subjected to patterning through a lift-off process. As a result, a first metal layer 151 forming ohmic contact with the first conductive type semiconductor layer 121 through a first opening 140a and a second metal layer 153 electrically connected to the transparent electrode 130 through a second opening 140b may be formed. As described above, the first metal layer 151 and the second metal layer 153 may be formed by the same process and may be insulated from each other by patterning.

When the first insulation layer 140 further covers the side surface of the light emitting structure 120, the metal layer 150 may also be formed on the first insulation layer 140 covering the side surface of the light emitting structure 120.

Referring to FIG. 14, a second insulation layer 160 is formed to partially cover the metal layer 150, the first insulation layer 140 and the transparent electrode 130.

The second insulation layer 160 may be formed through deposition of an insulation material such as $SiO_2$ and $SiN_x$, and may be patterned to include a third opening 160a and a fourth opening 160b through lift-off or etching. The third opening 160a partially exposes the metal layer 150 and may define a portion through which the first electrode 171 is electrically connected to the metal layer 150. Likewise, the fourth opening 160b partially exposes the transparent electrode 130, and may define a portion through which the second electrode 173 is electrically connected to the transparent electrode 130. As shown in the drawings, the third opening 160a and the fourth opening 160b may be disposed at opposite sides, respectively.

Next, referring to FIG. 15, a first electrode 171, a second electrode 173 and an insulation unit 180 are formed on the light emitting structure 120. The first electrode 171, the second electrode 173, and the insulation unit 180 may be formed by any sequence instead of being limited to a particular sequence.

The first electrode 171 and the second electrode 171 may be formed by deposition, plating, or the like, and the insulation unit 180 may be formed by deposition, coating, or the like.

Referring to FIG. 16, the growth substrate 110 is separated from the light emitting structure.

The growth substrate 110 may be separated from the light emitting structure by laser lift-off, chemical lift-off, stress lift-off, thermal lift-off, and the like, or may be removed therefrom by physical and/or chemical methods such as lapping, grinding, or CMP.

As a result, a light emitting device as shown in FIG. 1 may be provided. Furthermore, when a wavelength conversion layer 190 is further formed on one surface of the light emitting structure 120 exposed by removing the growth substrate 110, a light emitting device as shown in FIG. 3a may be provided.

Although the light emitting devices are illustrated as having the growth substrate 110 removed from the light emitting structure 120 in the above exemplary embodiments, the present disclosure is not limited thereto and other implementations are possible. All of the light emitting devices described above may further include the growth substrate 110 and the wavelength conversion layer 190 may be formed on the growth substrate 110 thereof.

Although some exemplary embodiments are disclosed in conjunction with the drawings, it should be understood that these embodiments and the accompanying drawings are provided for illustration only and are not to be construed as limiting the present disclosure. The scope of the present disclosure should be interpreted according to the following appended claims as covering all modifications or variations derived from the appended claims and equivalents thereof.

The invention claimed is:

1. A light emitting device comprising:
a light emitting structure including a first conductive type semiconductor layer, a second conductive type semiconductor layer disposed on the first conductive type semiconductor layer, and an active layer disposed between the first and second conductive type semiconductor layers, the first conductive type semiconductor layer having an upper surface with a partially exposed region;
a transparent electrode disposed on the second conductive type semiconductor layer and forming ohmic contact with the second conductive type semiconductor layer;
a first insulation layer covering the light emitting structure and the transparent electrode, and including a first opening and a second opening exposing the partially exposed region of the upper surface of the first conductive type semiconductor layer and a portion of the transparent electrode, respectively;
a current blocking layer disposed a region of the second conductive type semiconductor layer;
a first metal layer forming ohmic contact with the first conductive type semiconductor layer through the first opening and extending from the first opening to a region on the insulation layer above the upper surface of the second conductive type semiconductor layer;
a second metal layer contacting the transparent electrode through the second opening;
a first electrode electrically connected to the first conductive type semiconductor layer; and
a second electrode electrically connected to the transparent electrode;
wherein the first metal layer and the second metal layer are separated from each other.

2. The light emitting device of claim 1, wherein a portion in which the transparent electrode, the first insulation layer and the metal layer are stacked provides an omnidirectional reflector.

3. The light emitting device of claim 1, wherein the transparent electrode includes a conductive oxide, the insulation layer includes a silicon oxide or a silicon nitride, and the metal layer includes a light-reflective metal.

4. The light emitting device of claim 3, wherein the transparent electrode includes indium tin oxide (ITO), the insulation layer includes a silicon dioxide ($SiO_2$), and the metal layer includes Ag and/or Al.

5. The light emitting device of claim 1, further including:
a contact electrode disposed on the partially exposed region of the upper surface of the first conductive type semiconductor layer,
wherein the contact electrode includes a same material as the transparent electrode.

6. The light emitting device of claim 1, further including:
a second insulation layer covering the metal layer,
wherein the second insulation layer includes a third opening exposing the first metal layer and a fourth opening exposing the second metal layer.

7. The light emitting device of claim 1, wherein the first and second electrodes are disposed on the light emitting structure.

8. The light emitting device of claim 7, further including:
an insulation unit at least partially covering side surfaces of the first electrode and the second electrode and disposed between the first and second electrodes.

9. The light emitting device of claim 1, wherein the transparent electrode covers an overall upper surface of the second conductive type semiconductor layer.

10. The light emitting device of claim 1, wherein the first insulation layer and the metal layer further cover at least a portion of a side surface of the light emitting structure.

11. The light emitting device of claim 1, further including:
a wavelength conversion layer disposed under a lower surface of the light emitting structure such that the wavelength conversion layer is disposed opposite to the transparent electrode.

12. The light emitting device of claim 1, further including:
a second insulation layer covering the metal layer and including a third opening exposing a region corresponding to the first opening,
wherein the first electrode is disposed on the second insulation layer.

13. The light emitting device of claim 1, wherein the partially exposed region of the upper surface of the first conductive type semiconductor layer is formed in a hole shape passing through the second conductive type semiconductor layer and the active layer, and the light emitting structure includes at least one hole passing through the second conductive type semiconductor layer and the active layer.

14. The light emitting device of claim 1, wherein the light emitting structure includes at least one mesa including the second conductive type semiconductor layer and the active layer, and the at least one mesa is not formed over the partially exposed region of the upper surface of the first conductive type semiconductor layer.

15. The light emitting device of claim 1, wherein the first insulation layer includes a plurality of nano-rods separated from one another or a plurality of nano-holes separated from one another.

16. A light emitting device comprising:
a light emitting structure including a first conductive type semiconductor layer, an active layer formed over the first conductive type semiconductor layer, and a second conductive type semiconductor layer formed over the active layer, wherein the light emitting structure has an opening passing through the active layer and the second conductive type semiconductor layer and having an inclined side surface;
a current blocking layer disposed on a first region of the second conductive type semiconductor layer;
a transparent layer formed over a second region of the second conductive type semiconductor layer;
a first metal layer disposed over the light emitting structure and connected to the first electrode;
a second metal layer disposed over the light emitting structure and connected to the second electrode;
a first electrode formed over the transparent layer and electrically connected to the first conductive type semiconductor layer through the opening; and a second electrode formed over the transparent layer and electrically connected to the transparent layer.

17. The light emitting device of claim 16, wherein the first metal layer includes a portion directly contacting to the first conductive type semiconductor layer through the opening.

18. The light emitting device of claim 16, wherein the light emitting structure includes roughness formed on a surface of the first conductive type semiconductor layer, the surface being opposite to the opening of the light emitting structure.

19. A light emitting device comprising:
a light emitting structure including a first conductive type semiconductor layer, a second conductive type semiconductor layer disposed on the first conductive type semiconductor layer, and an active layer disposed between the first and second conductive type semiconductor layers, the first conductive type semiconductor layer having an upper surface with a partially exposed region;
a transparent electrode disposed on the second conductive type semiconductor layer and forming ohmic contact with the second conductive type semiconductor layer;
a first insulation layer covering the light emitting structure and the transparent electrode, and including a first opening and a second opening exposing the partially exposed region of the upper surface of the first conductive type semiconductor layer and a portion of the transparent electrode, respectively;
a current blocking layer disposed a region of the second conductive type semiconductor layer;
a metal layer at least partially covering the first insulation layer and including a portion disposed above an upper surface of the second conductive type semiconductor layer;
a first electrode electrically connected to the first conductive type semiconductor layer; and
a second electrode electrically connected to the transparent electrode;
a second insulation layer covering the metal layer and including a third opening exposing a region corresponding to the first opening,
wherein the first electrode is disposed on the second insulation layer.

20. A light emitting device comprising:
a light emitting structure including a first conductive type semiconductor layer, a second conductive type semiconductor layer disposed on the first conductive type semiconductor layer, and an active layer disposed between the first and second conductive type semiconductor layers, the first conductive type semiconductor layer having an upper surface with a partially exposed region;
a transparent electrode disposed on the second conductive type semiconductor layer and forming ohmic contact with the second conductive type semiconductor layer;
a first insulation layer covering the light emitting structure and the transparent electrode, and including a first opening and a second opening exposing the partially exposed region of the upper surface of the first conductive type semiconductor layer and a portion of the transparent electrode, respectively;
a current blocking layer disposed a region of the second conductive type semiconductor layer;
a metal layer at least partially covering the first insulation layer and including a portion disposed above an upper surface of the second conductive type semiconductor layer;
a first electrode electrically connected to the first conductive type semiconductor layer; and
a second electrode electrically connected to the transparent electrode;
wherein the partially exposed region of the upper surface of the first conductive type semiconductor layer is formed in a hole shape passing through the second conductive type semiconductor layer and the active layer, and the light emitting structure includes at least one hole passing through the second conductive type semiconductor layer and the active layer.

21. A light emitting device comprising:
a light emitting structure including a first conductive type semiconductor layer, a second conductive type semiconductor layer disposed on the first conductive type semiconductor layer, and an active layer disposed between the first and second conductive type semiconductor layers, the first conductive type semiconductor layer having an upper surface with a partially exposed region;
a transparent electrode disposed on the second conductive type semiconductor layer and forming ohmic contact with the second conductive type semiconductor layer;
a first insulation layer covering the light emitting structure and the transparent electrode, and including a first opening and a second opening exposing the partially exposed region of the upper surface of the first conductive type semiconductor layer and a portion of the transparent electrode, respectively;
a current blocking layer disposed a region of the second conductive type semiconductor layer;
a metal layer at least partially covering the first insulation layer and including a portion disposed above an upper surface of the second conductive type semiconductor layer;
a first electrode electrically connected to the first conductive type semiconductor layer; and
a second electrode electrically connected to the transparent electrode;
wherein the light emitting structure includes at least one mesa including the second conductive type semiconductor layer and the active layer, and the at least one mesa is not formed over the partially exposed region of the upper surface of the first conductive type semiconductor layer.

* * * * *